(12) United States Patent
Liu et al.

(10) Patent No.: US 11,735,657 B2
(45) Date of Patent: Aug. 22, 2023

(54) METHOD FOR FABRICATING TRANSISTOR STRUCTURE

(71) Applicant: United Microelectronics Corp., Hsinchu (TW)

(72) Inventors: Tseng Hsun Liu, Taipei (TW); Min-Hsuan Tsai, Tainan (TW); Ke-Feng Lin, Taipei (TW); Ming-Yen Liu, Hsinchu (TW); Wen-Chung Chang, Hsinchu (TW); Cherng-En Sun, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 17/852,371

(22) Filed: Jun. 29, 2022

(65) Prior Publication Data

US 2022/0328685 A1 Oct. 13, 2022

Related U.S. Application Data

(62) Division of application No. 17/171,760, filed on Feb. 9, 2021, now Pat. No. 11,417,761.

(51) Int. Cl.
*H01L 29/423* (2006.01)
*H01L 29/78* (2006.01)
(Continued)

(52) U.S. Cl.
CPC ...... *H01L 29/7825* (2013.01); *H01L 29/1095* (2013.01); *H01L 29/4236* (2013.01); *H01L 29/6656* (2013.01)

(58) Field of Classification Search
CPC ......... H01L 29/10; H01L 29/66; H01L 29/78; H01L 29/417; H01L 29/423; H01L 29/1095; H01L 29/7825; H01L 29/4236; H01L 29/6656; H01L 29/42356; H01L 29/51; H01L 29/518; H01L 29/66659; H01L 29/41766; H01L 29/42368; H01L 29/7835; H01L 29/6684; H01L 29/66833; H01L 29/66636; H01L 29/66643; H01L 29/66613; H01L 29/7929; H01L 29/66628;
(Continued)

(56) References Cited

U.S. PATENT DOCUMENTS 6,664,163 B2 * 12/2003 Fujishima ........... H01L 29/7813
257/E29.267
8,115,253 B2 2/2012 Tang et al.
(Continued)

*Primary Examiner* — Chuong A Luu
(74) *Attorney, Agent, or Firm* — JCIPRNET

(57) ABSTRACT

A method for fabricating a transistor includes providing a substrate, having a gate region and a first trench in the substrate at a first side of the gate region; forming a first gate insulating layer, disposed on a first portion of the gate region, opposite to the first trench; forming a second gate insulating layer, disposed on a second portion of the gate region and a first portion of the first trench abutting to the gate region, wherein the second gate insulating layer is thicker than the first gate insulating layer; forming a gate layer, disposed on the first and second gate insulating layers, having a downward protruding portion corresponding to the first trench; forming a first doped region in the substrate at least under the first trench; and forming a second doped region in the substrate at a second side of the gate region.

9 Claims, 3 Drawing Sheets

(51) Int. Cl.
*H01L 29/66* (2006.01)
*H01L 29/10* (2006.01)

(58) Field of Classification Search
CPC ............. H01L 29/66734; H01L 29/792; H01L 29/0843; H01L 29/0891; H01L 29/42352; H01L 29/42336; H01L 29/7813; H01L 21/8234; H01L 21/823418; H01L 21/823425; H01L 21/8238; H01L 21/823814
USPC ................................ 438/259, 270, 271, 589
See application file for complete search history.

(56) References Cited

U.S. PATENT DOCUMENTS

| | | |
|---|---|---|
| 9,583,617 B2 | 2/2017 | Hsiao et al. |
| 2009/0140343 A1 | 6/2009 | Feilchenfeld et al. |
| 2010/0237412 A1* | 9/2010 | Shrivastava ...... H01L 29/42376 |
| | | 257/E29.256 |
| 2013/0049108 A1 | 2/2013 | Chen et al. |
| 2016/0111488 A1 | 4/2016 | Lu et al. |
| 2019/0035929 A1* | 1/2019 | Syue .................... H01L 29/1037 |
| 2019/0097044 A1* | 3/2019 | Lee .................... H01L 29/42376 |
| 2021/0066451 A1* | 3/2021 | Chen .................... H01L 29/0692 |

* cited by examiner

METHOD FOR FABRICATING TRANSISTOR STRUCTURE

CROSS-REFERENCE TO RELATED APPLICATION

This application is a divisional application of and claims the priority benefit of U.S. application Ser. No. 17/171,760, filed on Feb. 9, 2021, now allowed. The entirety of the above-mentioned patent application is hereby incorporated by reference herein and made a part of this specification.

BACKGROUND OF THE INVENTION

Field of the Invention

The invention relates to technology to fabricate semiconductor device and more particularly relates to a transistor structure and the fabrication method thereof.

Description of Related Art

The metal-oxide-semiconductor (MOS) transistor has been proposed and widely used in the integrated circuit based on the semiconductor fabrication technology. As the development is continuously made, the integrated circuit is not just limited to the operation with low voltage, such as 3V to 10V. The integrate circuit with more driving capability, such as the power source circuit, may involve some operation at the high voltage level.

The MOS transistor in high voltage operation needs to have high break down voltage. At the same time, the turning on current needs to be effectively brought down for easy operation. The high voltage (HV) transistor usually needs a thicker gate insulating layer however, the gate structure needs to be properly designed to have relatively low turn-on voltage.

A lateral diffusion metal-oxide-semiconductor field effect transistor (LDMOSFET) is a field effect transistor having a drift region between a gate and a drain region in order to avoid a high electric field at a drain junction, i.e., at the p-n junction between a body and the drain region. An LDMOSFET is typically employed in high voltage power applications involving voltages in the range from about 5 V to about 500 V, which is applied across the drain region and the source region. A substantial fraction of the high voltage may be consumed within the drift region in the LDMOSFET so that the electric field generated across the gate dielectric does not cause breakdown of the gate dielectric.

However, the transistor structure for the HV operation in an example based on the LDMOSFET is still under development.

SUMMARY OF THE INVENTION

The invention provides a transistor structure and the method to fabricate the transistor device. The transistor is based on the structure of LDMOSFET, in which the breakdown voltage may remain high and the turn-on voltage may remain low.

In an embodiment, the invention provides a transistor structure, including a substrate. The substrate has a gate region and a first trench in the substrate at a first side of the gate region. In addition, a first gate insulating layer is disposed on a first portion of the gate region, opposite to the first trench. A second gate insulating layer is disposed on a second portion of the gate region and a first portion of the first trench abutting to the gate region, wherein the second gate insulating layer is thicker than the first gate insulating layer. A gate layer is disposed on the first and second gate insulating layers, having a downward protruding portion corresponding to the first trench. A first doped region is in the substrate at least under the first trench. A second doped region is in the substrate at a second side of the gate region.

In an embodiment, as to the transistor structure, the substrate further comprises a second trench in the substrate at a second side of the gate region, wherein the second doped region is at least within the second trench.

In an embodiment, as to the transistor structure, in a cross-section view, a radius of a first bottom corner of the first trench for adapting the downward protruding portion of the gate layer is larger than a radius of a second bottom corner of the second trench adjacent to the gate layer.

In an embodiment, as to the transistor structure, it further includes a first spacer on a first sidewall of the downward protruding portion of the gate layer extending into the first trench and on the second gate insulating layer and a second spacer on a second sidewall of the gate layer extending into the second trench and on the substrate. A bottom surface of the second spacer is lower than a bottom surface of the first spacer.

In an embodiment, as to the transistor structure, it further includes a trench isolation structure in the substrate abut to the first trench opposite to the gate region.

In an embodiment, as to the transistor structure, the first doped region in the substrate extends to an interface between the first gate insulating layer and the second gate insulating layer.

In an embodiment, as to the transistor structure, the first doped region serves as a drain region and the second doped region serves as a source region.

In an embodiment, as to the transistor structure, the first doped region comprises: a first region under the first trench of the substrate and also extending to an edge of the first gate insulating layer; and a second region as heavily doped in the first trench of the substrate at a second portion not covered by the second gate insulating layer. The second region is used to receive a drain voltage.

In an embodiment, as to the transistor structure, the substrate further comprises a second trench in the substrate at the second side of the gate region, wherein the second doped region comprises: a body region of a first conductive type, within the second trench of the substrate. In addition, a first heavily doped region of a second conductive type is disposed on the body region. A second heavily doped region of the first conductive type is disposed on the body region and penetrating through the first heavily doped region, to receive a source voltage.

In an embodiment, as to the transistor structure, the substrate includes a deep doped well of the first conductive type under the first dopes region, the second doped region and the gate region. The first conductive type is P-type and the second conductive type is N-type.

In an embodiment, the invention also provides a method for fabricating a transistor, including providing a substrate, having a gate region and a first trench in the substrate at a first side of the gate region. In addition, a first gate insulating layer is formed and disposed on a first portion of the gate region, opposite to the first trench. A second gate insulating layer is formed and disposed on a second portion of the gate region and a first portion of the first trench abutting to the gate region, wherein the second gate insulating layer is thicker than the first gate insulating layer. A gate layer is formed and disposed on the first and second gate insulating layers, having a downward protruding portion corresponding to the first trench. A first doped region is formed in the substrate at least under the first trench. A second doped region is formed in the substrate at a second side of the gate region.

In an embodiment, as to the method for fabricating a transistor, the substrate as provided further comprises a second trench in the substrate at a second side of the gate region, wherein the second doped region is at least within the second trench.

In an embodiment, as to the method for fabricating a transistor, in a cross-section view, a radius of a first bottom corner of the first trench for adapting the downward protruding portion of the gate layer is larger than a radius of a second bottom corner of the second trench adjacent to the gate layer.

In an embodiment, as to the method for fabricating a transistor, it further includes forming a first spacer on a first sidewall of the downward protruding portion of the gate layer extending into the first trench and on the second gate insulating layer. In addition, a second spacer on a second sidewall of the gate layer extending into the second trench and on the substrate. A bottom surface of the second spacer is lower than a bottom surface of the first spacer.

In an embodiment, as to the method for fabricating a transistor, it further includes forming a trench isolation structure in the substrate abut to the first trench opposite to the gate region.

In an embodiment, as to the method for fabricating a transistor, the first doped region in the substrate is extending to an interface between the first gate insulating layer and the second gate insulating layer.

In an embodiment, as to the method for fabricating a transistor, the first doped region as formed serves as a drain region and the second doped region serves as a source region.

In an embodiment, as to the method for fabricating a transistor, the first doped region as formed comprises: a first region under the first trench of the substrate and also extending to an edge of the first gate insulating layer; and a second region as heavily doped in the first trench of the substrate at a second portion not covered by the second gate insulating layer. The second region is used to receive a drain voltage.

In an embodiment, as to the method for fabricating a transistor, the substrate as provided further comprises a second trench in the substrate at the second side of the gate region, wherein the second doped region comprises a body region of a first conductive type, within the second trench of the substrate. In addition, a first heavily doped region of a second conductive type is disposed on the body region. A second heavily doped region of the first conductive type is disposed on the body region and penetrating through the first heavily doped region, to receive a source voltage.

In an embodiment, as to the method for fabricating a transistor, the substrate as provided includes a deep doped well of the first conductive type under the first dopes region, the second doped region and the gate region. The first conductive type is P-type and the second conductive type is N-type.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention is directed to MOS transistor, such as the LDMOSFET, operated in the HV range. The breakdown voltage may remain high and the turn-on voltage may be effectively reduced.

Multiple embodiments are provided for description of the invention but the invention is not just limited to the embodiments as provided.

Figure 1:
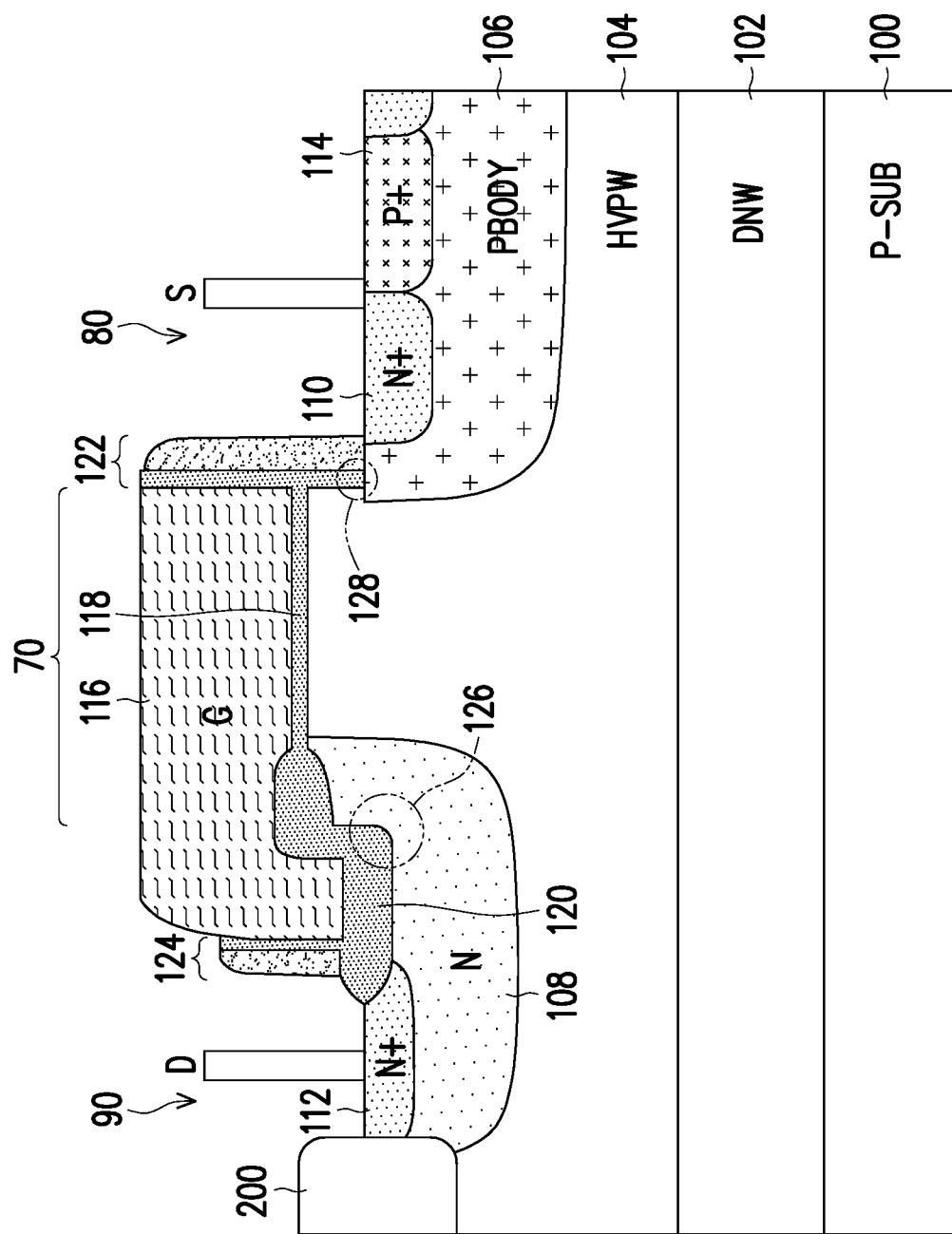
FIG. 1 is a drawing, schematically illustrating a transistor structure in a cross-section view, according to an embodiment of the invention.

FIG. 1 is a drawing, schematically illustrating a transistor structure in a cross-section view, according to an embodiment of the invention.

Referring to FIG. 1, a transistor structure based on the design of LDMOSFET is provided in an embodiment. The substrate 100 usually in an example is a p-type substrate (P-SUB). Depending on the fabrication process, the HV transistor may be may be fabricated in some region of the substrate 100 together with the usual MOS transistors at the other region. A deep N-type well (DNW) 102 is formed in the substrate 100. In an embodiment, an N-type HV transistor as an example to be fabricated, then a HV p-type well (104) is further formed in the substrate 100. However, the invention is not limited to the conductive type. The doped well, such as the HVPW 104 and the DNW 102 may be modified according to the conductive type of the transistor to fabricated. The invention provides the gate structure of the HV transistor. Various doping regions may be accordingly modified.

In the embodiment for the N-type HV transistor, the source region 110 and the drain region 112 are formed in the substrate 100 at two sides of the gate layer (G) 116. The source region 110 is connected to the source voltage (S) and the drains region is connected to the drain voltage (D). To the HV transistor, in an embodiment, additional doped region such as the doped region 108 in N-type is formed in the substrate under the drain region 112 and the doped region 106 in P-type, as indicated by PBODY, is also formed in the substrate under the source region 110. In addition, a P-type doped region 114 is formed in the source region and also connected to the source voltage (S), based on the HV transistor. Various doped regions may be formed according to the actual need without specific limitation. The gate structure is further described as follows.

To have the transistor structure for operation in HV range, the substrate 100 has two trenches 80, 90 at two sides of gate region 70 at the preserved location. The trenches 80, 90 in an embodiment are shallow trenches such as in arrange of 1000 angstroms to 2000 angstroms in an example. As noted, the trench 90 is more essential for forming the drain region 112. The trenches 80 corresponding to the source region 110 is an option in fabrication. The gate layer 116 is to be formed over the gate region 70. The various doped regions as foregoing description, are formed corresponding to the trenches 80, 90.

For the design of HV transistor, a gate insulating layer 118 is disposed on a first portion of the gate region 70, opposite to the trench 90. A gate insulating layer 120 is disposed on a second portion of the gate region 70 and a first portion of the trench 90 abutting to the gate region 70. The gate insulating layer 120 is thicker than the gate insulating layer 118. The gate insulating layer 120 is suitable for the HV operation to endure high breakdown voltage, as to be describe later. The trench isolation 200 may also be used to generally isolate the transistor.

Due to the trench 90, the gate insulating layer 120 has a step structure at the side of the gate region 70. The gate insulating layer 120 is formed with the thermal oxidation on the substrate 100 with the silicon material. As a result, the bottom corner 126 of the trench 90 corresponding to the drain region 112 in the cross-section view is relatively rounded. The rounded bottom corner 126 relatively has smooth electric field and may increase the breakdown voltage and reduce the turn-on level of the transistor. To see the rounded shape for the bottom corner 128 of the trench 80 corresponding to the source region 110, the radius of the bottom corner 126 of the trench 90 is larger than the radius of the bottom corner 128 of the trench 80 in the usual process. In other words, the structure according to the embodiment of the invention, the gate insulating layer 120 may increase the breakdown voltage to endure high voltage and reduce the turn-on level for improving the operation efficiency.

Then, the gate layer 116 is disposed on the first gate insulating 118 and the and the gate insulating layer 120. Due to the trench 90, the gate layer 116 has a downward protruding portion corresponding to the trench 90. As noted, the gate layer 116 does not need to extend into the trench 80. In addition, the spacer 124 is formed on the sidewall of the downward protruding portion of the gate layer 116 is formed. The spacer 122 is formed on another sidewall of the gate layer 116 at the side abutting to the trench 80. As result, a bottom surface of the spacer 122 is lower than the bottom surface of the spacer 124 due to the structure of the gate insulating layer 120 with larger thickness than the gate insulating layer 118.

The first doped region as a general region including the doped regions 108, 112 for the drain electrode is formed in the substrate 100 at least under the trench 90 at one side of the gate region 70. The doped region 108 may extend to the edge of the gate insulating layer 118. To the source electrode S, a second doped region including various doped regions with proper conductive types is formed in the substrate 100 at a second side of the gate region 70.

It may be noted that, the gate layer 116 includes the downward protruding portion, extending into the trench 90. To another design without the trench 90 and the downward protruding portion as looked into in the invention, the trench 90 is not formed in the substrate but a shallow trench isolation (STI) instead is formed in the substrate adjacent to the gate region 70. Then, design of STI may raise the gate layer up from the height of the gate region 70. With this design as looked into in the invention, the gate layer 116 with the downward protruding portion into the trench 90 may improve the performance of the HV transistor.

The fabrication process is further described to form the gate layer 116. FIG. 2A to FIG. 2D are drawings, schematically illustrating a fabrication process to from the transistor structure, according to an embodiment of the invention.

Figure 2A:
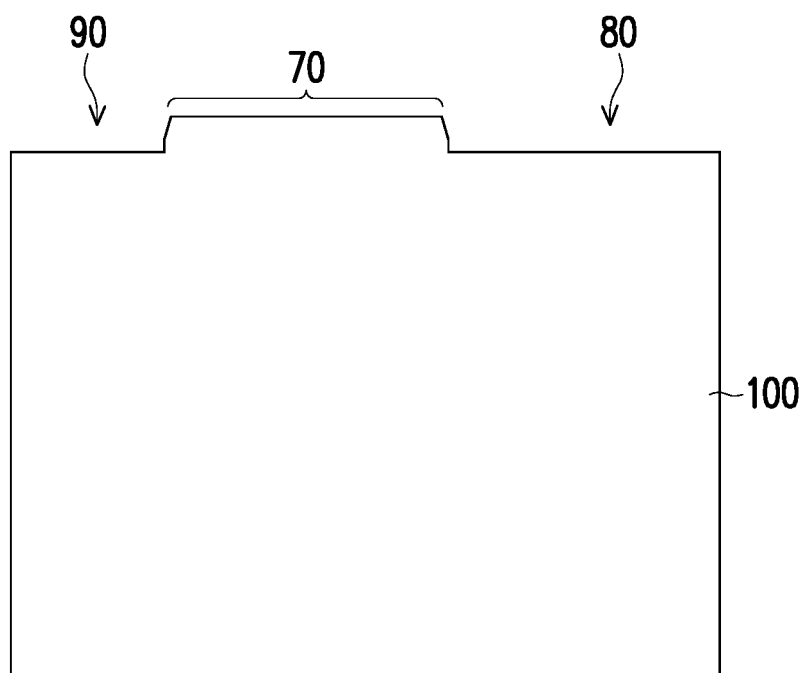
FIG. 2A to FIG. 2D are drawings, schematically illustrating a fabrication process to from the transistor structure, according to an embodiment of the invention.

Referring to FIG. 2A, the trench 80 and the trench 90 are formed in the substrate 100 at two sides of the gate region 70 as preserved. The trench 90 in an embodiment may be a shallow trench, such as in arrange of 1000 angstroms to 2000 angstroms. The depth of the trench 90 is less than the usual depth of the shallow trench isolation (STI) 200 (see FIG. 1). The trench 80 may also be formed at the same patterning process. However, the trench 80 corresponding to the source electrode S is an option in fabrication. The trench 90 corresponding to the drain electrode D is intended.

Figure 2B:
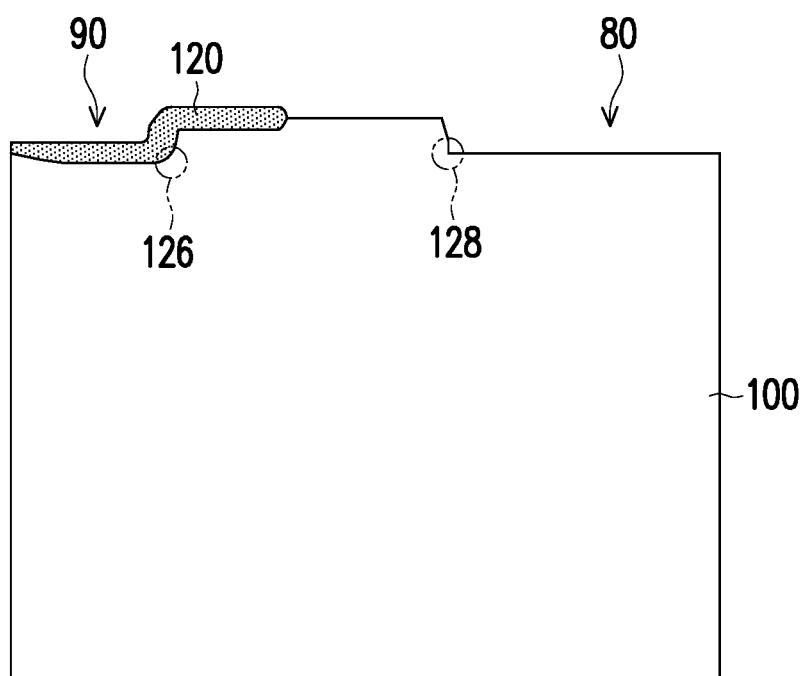

Referring to FIG. 2B, the gate insulating layer 120 is formed by thermal oxidation process. Here, a mask may be involved as usually taken to locally form the gate insulating layer 120. The gate insulating layer 120 would cover a portion of the gate region 70 and a portion of the trench 90 with the step structure. Due to the oxidation, the bottom corner 126 is relatively rounded due to the oxidation process consuming the silicon of the substrate 100. Qualitatively, the radius of the bottom corner 126 is larger the radius of the bottom corner 128 of the trench 80, which has a sharp corner as usually formed from the trench 80.

Further, various dopes regions as illustrating in FIG. 1 may be formed in the substrate 100 by implanting process at this stage or later, without specific limitation. The descriptions for forming the doped regions are skipped and mat referring to the implanting processes as known in the art to have the structure in FIG. 1.

Referring to FIG. 2B, a preliminary gate insulating layer 118 in an example may be formed over the substrate 100. The gate insulating layer 118 is thinner than the gate insulating layer 120. The gate insulating layer 118 would be patterned together with the gate layer 116. In other words, a portion of the gate insulating layer 118 would cover on the gate region 70. Here, a mask may also be used to just cover the exposed portion of the gate region 70. However, the mask may cause more process step in fabrication cost, depending on the choice.

Figure 2C:
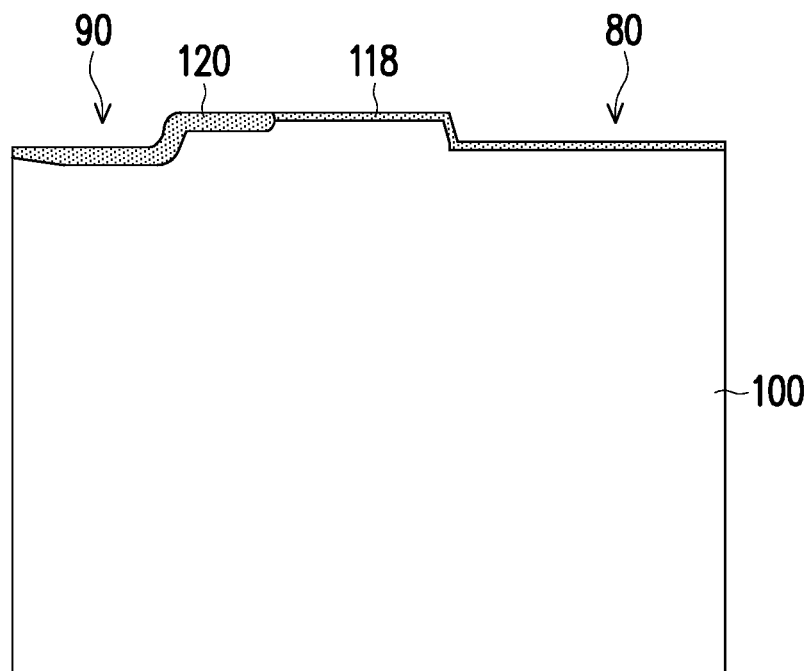
Figure 2D:
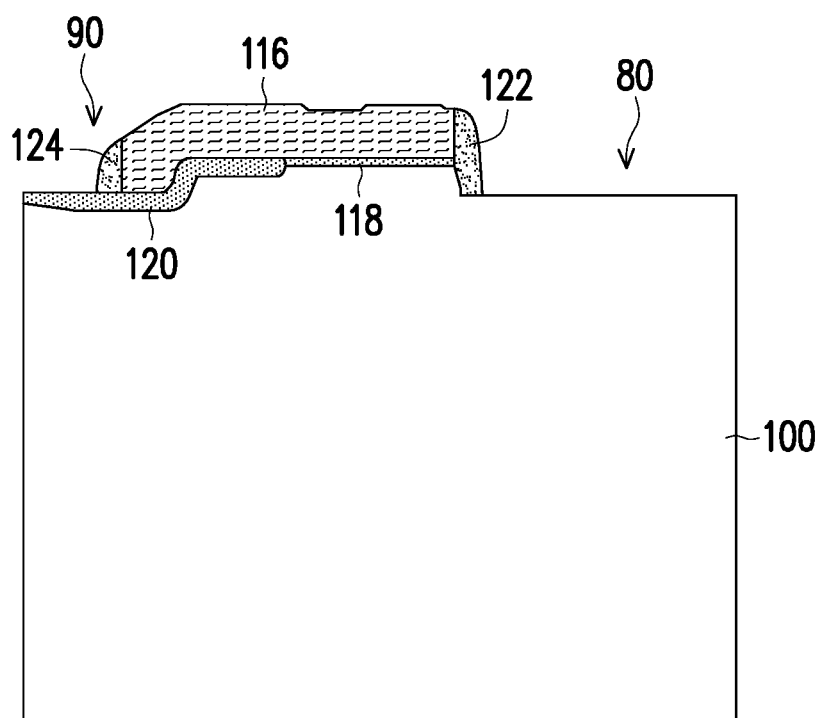

Referring to FIG. 2D, a preliminary gate layer 116 may be formed over the substrate 100. In the example of FIG. 2C, the preliminary gate layer 116 is disposed on the preliminary gate insulating layer 118 and then patterned together to form the gate layer 116 with the gate insulating layer 118 and the gate insulating layer 120. A portion not cover by the gate layer 118 may be removed to expose the substrate 100.

Here as noted, the gate layer 118 after patterned includes a downward extending portion entering to the trench 90. However, the other side of the gate layer 118 may be still disposed on gate region 70 without enter the trench 80. The trench 80 is also an option for fabrication without absolutely requirement. The material of the gate layer 118 in an example is polysilicon. However, the gate layer 118 may be other material or a stack from multiple material layers, depending on the design of the gate layer 118.

Then the spacers 124 and the spacer 122 are formed on the sidewall of the gate layer 116. As noted, due to the structure involving the gate insulating layer 120, the bottom surface of the spacer 122 on the substrate 100 at the trench 80 is lower than the spacer 124 on the gate insulating layer 120. Also noted, the spacer 124 and the spacer 122 may include oxide and nitride in stack. The spacer 124 and the spacer 122 here may be formed by the usually process including depositing layer and performing an etching back process.

As to the fabrication process and referring to FIG. 1 and FIG. 2A to FIG. 2D, the method may include providing a substrate 100 having a gate region 70 and a trench 90 in the substrate 100 at a first side of the gate region 70. In addition, a gate insulating layer 118 is formed and disposed on a first portion of the gate region 70, opposite to the trench 90. Another gate insulating layer 120 is formed and disposed on another portion of the gate region 70 and a portion of the trench 90 abutting to the gate region 70. The gate insulating layer 120 is thicker than the gate insulating layer 118. A gate layer 116 is formed and disposed on the gate insulating layer 118 and the gate insulating layer 120, having a downward protruding portion corresponding to the trench 90. A doped region corresponding to the drain electrode D is formed in the substrate 100 at least under the trench 90. Another doped region corresponding to the source electrode S is formed in the substrate 100 at another side of the gate region 70.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A method for fabricating a transistor, comprising:
   providing a substrate, having a gate region and a first trench in the substrate at a first side of the gate region;
   forming a first gate insulating layer, disposed on a first portion of the gate region, opposite to the first trench;
   forming a second gate insulating layer, disposed on a second portion of the gate region and a first portion of the first trench abutting to the gate region, wherein the second gate insulating layer is thicker than the first gate insulating layer;
   forming a gate layer, disposed on the first and second gate insulating layers, having a downward protruding portion corresponding to the first trench;
   forming a first doped region in the substrate at least under the first trench; and
   forming a second doped region in the substrate at a second side of the gate region, wherein the substrate as provided further comprises a second trench in the substrate at a second side of the gate region, wherein the second doped region is at least within the second trench.

2. The method of claim 1, wherein, as to a cross-section view, a radius of a first bottom corner of the first trench for adapting the downward protruding portion of the gate layer is larger than a radius of a second bottom corner of the second trench adjacent to the gate layer.

3. The method of claim 1, further comprising forming:
   a first spacer on a first sidewall of the downward protruding portion of the gate layer extending into the first trench and on the second gate insulating layer; and
   a second spacer on a second sidewall of the gate layer extending into the second trench and on the substrate, wherein a bottom surface of the second spacer is lower than a bottom surface of the first spacer.

4. The method of claim 1, further comprising forming a trench isolation structure in the substrate abut to the first trench opposite to the gate region.

5. The method of claim 1, wherein the first doped region in the substrate is extending to an interface between the first gate insulating layer and the second gate insulating layer.

6. The method of claim 1, wherein the first doped region as formed serves as a drain region and the second doped region serves as a source region.

7. The method of claim 6, wherein the first doped region as formed comprises:
   a first region under the first trench of the substrate and also extending to an edge of the first gate insulating layer; and
   a second region as heavily doped in the first trench of the substrate at a second portion not covered by the second gate insulating layer,
   wherein the second region is used to receive a drain voltage.

8. The method of claim 7, wherein the second doped region comprises:
   a body region of a first conductive type, within the second trench of the substrate;
   a first heavily doped region of a second conductive type, disposed on the body region; and
   a second heavily doped region of the first conductive type, disposed on the body region and penetrating through the first heavily doped region, to receive a source voltage.

9. The method of claim 8, wherein the substrate as provided comprises a deep doped well of the first conductive type under the first dopes region, the second doped region and the gate region, wherein the first conductive type is P-type and the second conductive type is N-type.

* * * * *